United States Patent
Walter et al.

(10) Patent No.: US 8,179,937 B2
(45) Date of Patent: May 15, 2012

(54) HIGH SPEED LIGHT EMITTING SEMICONDUCTOR METHODS AND DEVICES

(75) Inventors: Gabriel Walter, Champaign, IL (US); Milton Feng, Champaign, IL (US); Nick Holonyak, Jr., Urbana, IL (US); Han Wui Then, Hillsboro, OR (US); Chao-Hsin Wu, Champaign, IL (US)

(73) Assignees: Quantum Electro Opto Systems Sdn. Bhd., Melaka (MY); The Board of Trustees of The University of Illinois, Urbana, IL (US)

( * ) Notice: Subject to any disclaimer, the term of this patent is extended or adjusted under 35 U.S.C. 154(b) by 0 days.

(21) Appl. No.: 12/799,083

(22) Filed: Apr. 16, 2010

(65) Prior Publication Data

US 2010/0272140 A1    Oct. 28, 2010

Related U.S. Application Data

(63) Continuation-in-part of application No. 12/655,806, filed on Jan. 7, 2010.

(60) Provisional application No. 61/204,560, filed on Jan. 8, 2009, provisional application No. 61/204,602, filed on Jan. 8, 2009, provisional application No. 61/208,422, filed on Feb. 24, 2009, provisional application No. 61/212,951, filed on Apr. 17, 2009, provisional application No. 61/268,119, filed on Jun. 9, 2009.

(51) Int. Cl.
*H01S 3/00* (2006.01)
(52) U.S. Cl. .................... 372/38.05; 372/29.013; 372/87
(58) Field of Classification Search ............. 372/29.013, 372/38.05, 87
See application file for complete search history.

(56) References Cited

U.S. PATENT DOCUMENTS 4,176,367 A    11/1979 Uematsu ..................... 357/19
(Continued)

FOREIGN PATENT DOCUMENTS

JP    61270885    12/1986

OTHER PUBLICATIONS

Electrical-Optical Signal Mixing and Multiplication (2→ 22 GHz) With a Tunnel Junction Transistor Laser, H.W. Then, C.H. Wu, G. Walter, M. Feng and N. Holonyak, Jr., Appl. Phys. Lett. 94, 10114 (2009).

(Continued)

*Primary Examiner* — Tod T Van Roy
(74) *Attorney, Agent, or Firm* — Martin Novack

(57) ABSTRACT

A method for producing a high frequency optical signal component representative of a high frequency electrical input signal component, includes the following steps: providing a semiconductor transistor structure that includes a base region of a first semiconductor type between semiconductor emitter and collector regions of a second semiconductor type; providing, in the base region, at least one region exhibiting quantum size effects; providing emitter, base, and collector electrodes respectively coupled with the emitter, base, and collector regions; applying electrical signals, including the high frequency electrical signal component, with respect to the emitter, base, and collector electrodes to produce output spontaneous light emission from the base region, aided by the quantum size region, the output spontaneous light emission including the high frequency optical signal component representative of the high frequency electrical signal component; providing an optical cavity for the light emission in the region between the base and emitter electrodes; and scaling the lateral dimensions of the optical cavity to control the speed of light emission response to the high frequency electrical signal component.

6 Claims, 7 Drawing Sheets

U.S. PATENT DOCUMENTS

| | | | | |
|---|---|---|---|---|
| 5,796,714 | A | 8/1998 | Chino et al. | 372/50 |
| 7,091,082 | B2 | 8/2006 | Feng et al. | 438/235 |
| 7,286,583 | B2 | 10/2007 | Feng et al. | 372/30 |
| 7,354,780 | B2 | 4/2008 | Feng et al. | 257/292 |
| 7,535,034 | B2* | 5/2009 | Walter et al. | 257/197 |
| 7,711,015 | B2 | 5/2010 | Holonyak et al. | 372/11 |
| 7,813,396 | B2 | 10/2010 | Feng et al. | 372/43.01 |
| 2001/0050934 | A1* | 12/2001 | Choquette et al. | 372/43 |
| 2003/0081642 | A1 | 5/2003 | Hwang et al. | 372/45 |
| 2005/0018730 | A1* | 1/2005 | Taylor et al. | 372/50 |
| 2005/0040387 | A1* | 2/2005 | Feng et al. | 257/14 |
| 2005/0040432 | A1 | 2/2005 | Feng et al. | 257/198 |
| 2005/0054172 | A1* | 3/2005 | Feng et al. | 438/313 |
| 2006/0093010 | A1* | 5/2006 | Sekiya et al. | 372/99 |
| 2008/0089368 | A1 | 4/2008 | Feng et al. | 372/25 |
| 2008/0205461 | A1 | 8/2008 | Henrichs | 372/29.023 |
| 2008/0240173 | A1 | 10/2008 | Holonyak et al. | 372/9 |
| 2009/0134939 | A1 | 5/2009 | Feng et al. | 327/581 |
| 2010/0034228 | A1 | 2/2010 | Holonyak et al. | 374/45 |
| 2010/0073086 | A1* | 3/2010 | Holonyak et al. | 330/149 |
| 2010/0103971 | A1 | 4/2010 | Then et al. | 372/45.01 |
| 2010/0289427 | A1* | 11/2010 | Walter et al. | 315/291 |
| 2010/0315018 | A1 | 12/2010 | Then et al. | 315/291 |

OTHER PUBLICATIONS

Scaling of Light Emitting Transistor for Multigigahertz Optical Bandwidth, C.H. Wu, G. Walter, H.W. Then, M. Feng and N. Holonyak, Jr., Appl. Phys. Lett. 94, 171101 (2009).

Device Performance of Light Emitting Transistors With C-Doped and Zn-Doped Base Layers, Y. Huang, J.-H. Ryou, R.D. Dupuis, F. Dixon, N. Holonyak, Jr., and M. Feng, IPRM '09 IEEE Intl. Conf. May 10-14, 2009.

Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004).

Quantum-Well-Base Heterojunction Bipolar Light-Emitting Transistor, M. Feng, N. Holonyak, Jr., and R. Chan, Appl. Phys. Lett. 84, 1952 (2004).

Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004).

Laser Operation of a Heterojunction Bipolar Light-Emitting Transistor, G. Walter, N. Holonyak, Jr., M. Feng, and R. Chan, Appl. Phys. Lett. 85, 4768 (2004).

Microwave Operation and Modulation of a Transistor Laser, R. Chan, M. Feng, N. Holonyak, Jr., and G. Walter, Appl. Phys. Lett. 86, 131114 (2005).

Room Temperature Continuous Wave Operation of a Heterojunction Bipolar Transistor Laser, M. Feng, N. Holonyak, Jr., G. Walter, and R. Chan, Appl. Phys. Lett. 87, 131103 (2005).

Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006).

The Transistor Laser, N. Holonyak, M Feng, Spectrum, IEEE vol. 43, Issue 2, Feb. 2006.

Signal Mixing in a Multiple Input Transistor Laser Near Threshold, M. Feng, N. Holonyak, Jr., R. Chan, A. James, and G. Walter, Appl. Phys. Lett. 88, 063509 (2006).

Collector Current Map of Gain and Stimulated Recombination on the Base Quantum Well Transitions of a Transistor Laser, R. Chan , N. Holonyak, Jr. , A. James , G. Walter, Appl. Phys. Lett. 88, 143508 (2006).

Collector Breakdown in the Heterojunction Bipolar Transistor laser, G. Walter, A. James, N. Holonyak, Jr., M. Feng, and R. Chan, Appl. Physics Lett. 88, 232105 (2006).

High-Speed ($\geq 1$ GHz) Electrical and Optical Adding, Mixing, and Processing of Square-Wave Signals With a Transistor Laser, M. Feng, N. Holonyak, Jr., R. Chan, A. James, and G. Walter, IEEE Photonics Technology Lett., vol. 18, No. 11, Jun. 1, 2006.

Graded-Base InGaN/GaN Heterojunction Bipolar Light-Emitting Transistors, B.F. Chu-Kung, M. Feng, G. Walter, and J. Holonyak, Jr. et al., Appl. Physics Lett. 89, 082108 (2006).

Carrier Lifetime and Modulation Bandwidth of a Quantum Well AlGaAs/InGaP/GaAs/InGaAs Transistor Laser, M. Feng, N. Holonyak, Jr., A. James, K. Cimino, G. Walter, and R. Chan, Appl. Phys. Lett 89, 113504 (2006).

Chirp in a Transistor Laser: Franz-Keldysh Reduction of the Linewidth Enhancement, G. Walter, A. James, N. Holonyak, Jr., and M. Feng, App. Phys. Lett. 90, 091109 (2007).

Photon-Assisted Breakdown, Negative Resistance, and Switching in a Quantum-Well Transistor Laser, A. James, G. Walter, M. Feng, and N. Holonyak, Jr., Appl. Phys. Lett. 90, 152109 (2007).

Franz-Keldysh Photon-Assisted Voltage-Operated Switching of a Transistor Laser, A. James, N. Holonyak, M. Feng, and G. Walter, Photonics Technology Letters, IEEE vol. 19 Issue: 9 (2007).

Experimental Determination of the Effective Minority Carrier Lifetime in the Operation of a Quantum-Well n-p-n Heterojunction Bipolar Light-Emitting Transistor of Varying Base Quantum-Well Design and Doping; H.W. Then, M. Feng, N. Holonyak, Jr., and C. H. Wu, Appl. Phys. Lett. 91, 033505 (2007).

Charge Control Analysis of Transistor Laser Operation, M. Feng, N. Holonyak, Jr., H. W. Then, and G. Walter, Appl. Phys. Lett. 91, 053501 (2007).

Optical Bandwidth Enhancement by Operation and Modulation of the First Excited State of a Transistor Laser, H. W. Then, M. Feng, and N. Holonyak, Jr., Appl. Phys. Lett. 91, 183505 (2007).

Modulation of High Current Gain ($\beta>49$) Light-Emitting InGaN/GaN Heterojunction Bipolar Transistors, B. F. Chu-Kung, C. H. Wu, G. Walter, M. Feng, N. Holonyak, Jr., T. Chung, J.-H. Ryou, and R. D. Dupuis, Appl. Phys. Lett. 91, 232114 (2007).

Collector Characteristics and the Differential Optical Gain of a Quantum-Well Transistor Laser, H. W. Then, G. Walter, M. Feng, and N. Holonyak, Jr., Appl. Phys. Lett. 91, 243508 (2007).

InAlGaAs/InP Light-Emitting Transistors Operating Near 1.55 µm, Yound Huang, Xue-Bing Zhang, Jae-Hyun Ryun, Russell D. Dupuis, Forest Dixon, Nick Holonyak, Jr., and Milton Feng., J. Appl. Phys. 103 114505 (2008).

Transistor Laser With Emission Wavelength at 1544 nm, F. Dixon, M. Feng, N. Holonyak, Jr., Yong Huang, X. B. Zhang, J. H. Ryou, and R. D. Dupuis, Appl. Phys. Lett. 93, 021111 (2008).

Optical Bandwidth Enhancement of Heterojunction Bipolar Transistor Laser Operation With an Auxiliary Base Signal, H.W. Then, G. Walter, M. Feng, and N. Holonyak, Jr., Appl. Phys. Lett. 93, 163504 (2008).

Bandwidth Extension by Trade-Off of Electrical and Optical Gain in a Transistor Laser: Three-Terminal Control, H. W. Then, M. Feng, and N. Holonyak, Jr., Appl. Phys. Lett. 94, 013509 (2009).

Tunnel Junction Transistor Laser, M. Feng, N. Holonyak, Jr., H. W. Then, C. H. Wu, and G. Walter, Appl. Phys. Lett. 94, 041118 (2009).

\* cited by examiner

HIGH SPEED LIGHT EMITTING SEMICONDUCTOR METHODS AND DEVICES

PRIORITY CLAIMS

This is a continuation-in-part of U.S. patent application Ser. No. 12/655,806, filed Jan. 7, 2010, incorporated herein by reference, which, in turn, claimed priority from three U.S. Provisional Patent Applications; namely, U.S. Provisional Application Ser. No. 61/204,560, filed Jan. 8, 2009, U.S. Provisional Application Ser. No. 61/204,602, filed Jan. 8, 2009, and U.S. Provisional Application Ser. No. 61/208,422, filed Feb. 24, 2009. Priority is also claimed from U.S. Provisional Patent Application Ser. No. 61/212,951, filed Apr. 17, 2009, and from U.S. Provisional Patent Application Ser. No. 61/268,119, filed Jun. 9, 2009, and both of said last mentioned U.S. Provisional Patent Applications are incorporated herein by reference.

GOVERNMENT RIGHTS

This invention was made with Government support, and the Government has certain rights in the invention.

RELATED APPLICATION

The subject matter of this Application relates to subject matter disclosed in copending U.S. patent application Ser. No. 12/799,080, filed of even date herewith and assigned to the same assignees as the present Application.

FIELD OF THE INVENTION

This invention relates to methods and devices for producing light emission in response to electrical signals. The invention also relates to methods and devices for producing high frequency light emission and laser emission from semiconductor devices with improved efficiency.

BACKGROUND OF THE INVENTION

A part of the background hereof lies in the development of heterojunction bipolar transistors which operate as light-emitting transistors and transistor lasers. Reference can be made for example, to U.S. Pat. Nos. 7,091,082, 7,286,583, 7,354,780, 7,535,034 and 7,693,195; U.S. Patent Application Publication Numbers US2005/0040432, US2005/0054172, US2008/0240173, US2009/0134939, and US2010/0034228; and to PCT International Patent Publication Numbers WO/2005/020287 and WO/2006/093883. Reference can also be made to the following publications: Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004); Quantum-Well-Base Heterojunction Bipolar Light-Emitting Transistor, M. Feng, N. Holonyak, Jr., and R. Chan, Appl. Phys. Lett. 84, 1952 (2004); Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004); Laser Operation Of A Heterojunction Bipolar Light-Emitting Transistor, G. Walter, N. Holonyak, Jr., M. Feng, and R. Chan, Appl. Phys. Lett. 85, 4768 (2004); Microwave Operation And Modulation Of A Transistor Laser, R. Chan, M. Feng, N. Holonyak, Jr., and G. Walter, Appl. Phys. Lett. 86, 131114 (2005); Room Temperature Continuous Wave Operation Of A Heterojunction Bipolar Transistor Laser, M. Feng, N. Holonyak, Jr., G. Walter, and R. Chan, Appl. Phys. Lett. 87, 131103 (2005); Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006); The Transistor Laser, N. Holonyak and M Feng, Spectrum, IEEE Volume 43, Issue 2, February 2006; Signal Mixing In A Multiple Input Transistor Laser Near Threshold, M. Feng, N. Holonyak, Jr., R. Chan, A. James, and G. Walter, Appl. Phys. Lett. 88, 063509 (2006); and Collector Current Map Of Gain And Stimulated Recombination On The Base Quantum Well Transitions Of A Transistor Laser, R. Chan, N. Holonyak, Jr., A. James, and G. Walter, Appl. Phys. Lett. 88, 14508 (2006); Collector Breakdown In The Heterojunction Bipolar Transistor Laser, G. Walter, A. James, N. Holonyak, Jr., M. Feng, and R. Chan, Appl. Phys. Lett. 88, 232105 (2006); High-Speed (/spl ges/1 GHz) Electrical And Optical Adding, Mixing, And Processing Of Square-Wave Signals With A Transistor Laser, M. Feng, N. Holonyak, Jr., R. Chan, A. James, and G. Walter, Photonics Technology Letters, IEEE Volume: 18 Issue: 11 (2006); Graded-Base InGaN/GaN Heterojunction Bipolar Light-Emitting Transistors, B. F. Chu-Kung et al., Appl. Phys. Lett. 89, 082108 (2006); Carrier Lifetime And Modulation Bandwidth Of A Quantum Well AlGaAs/InGaP/GaAs/InGaAs Transistor Laser, M. Feng, N. Holonyak, Jr., A. James, K. Cimino, G. Walter, and R. Chan, Appl. Phys. Lett. 89, 113504 (2006); Chirp In A Transistor Laser, Franz-Keldysh Reduction of The Linewidth Enhancement, G. Walter, A. James, N. Holonyak, Jr., and M. Feng, Appl. Phys. Lett. 90, 091109 (2007); Photon-Assisted Breakdown, Negative Resistance, And Switching In A Quantum-Well Transistor Laser, A. James, G. Walter, M. Feng, and N. Holonyak, Jr., Appl. Phys. Lett. 90, 152109 (2007); Franz-Keldysh Photon-Assisted Voltage-Operated Switching of a Transistor Laser, A. James, N. Holonyak, M. Feng, and G. Walter, Photonics Technology Letters, IEEE Volume: 19 Issue: 9 (2007); Experimental Determination Of The Effective Minority Carrier Lifetime In The Operation Of A Quantum-Well n-p-n Heterojunction Bipolar Light-Emitting Transistor Of Varying Base Quantum-Well Design And Doping; H. W. Then, M. Feng, N. Holonyak, Jr., and C. H. Wu, Appl. Phys. Lett. 91, 033505 (2007); Charge Control Analysis Of Transistor Laser Operation, M. Feng, N. Holonyak, Jr., H. W. Then, and G. Walter, Appl. Phys. Lett. 91, 053501 (2007); Optical Bandwidth Enhancement By Operation And Modulation Of The First Excited State Of A Transistor Laser, H. W. Then, M. Feng, and N. Holonyak, Jr., Appl. Phys. Lett. 91, 183505 (2007); Modulation Of High Current Gain ($\beta$>49) Light-Emitting InGaN/GaN Heterojunction Bipolar Transistors, B. F. Chu-Kung, C. H. Wu, G. Walter, M. Feng, N. Holonyak, Jr., T. Chung, J.-H. Ryou, and R. D. Dupuis, Appl. Phys. Lett. 91, 232114 (2007); Collector Characteristics And The Differential Optical Gain Of A Quantum-Well Transistor Laser, H. W. Then, G. Walter, M. Feng, and N. Holonyak, Jr., Appl. Phys. Lett. 91, 243508 (2007); Transistor Laser With Emission Wavelength at 1544 nm, F. Dixon, M. Feng, N. Holonyak, Jr., Yong Huang, X. B. Zhang, J. H. Ryou, and R. D. Dupuis, Appl. Phys. Lett. 93, 021111 (2008); and Optical Bandwidth Enhancement Of Heterojunction Bipolar Transistor Laser Operation With An Auxiliary Base Signal, H. W. Then, G. Walter, M. Feng, and N. Holonyak, Jr. Appl. Phys. Lett. 93, 163504 (2008).

Semiconductor light emitting diodes (LEDs) and lasers using direct gap III-V materials, and electron-hole injection and recombination, have over the years led to numerous applications in display and lightwave communications. While semiconductor lasers typically dominate long-distance communication links, fast spontaneous lightwave transmitters can be an attractive solution for short range optical data communications and optical interconnections as their threshold-less operation, high fabrication yield and reduced driver and feedback control complexity significantly reduce the overall cost, form factor and power consumption of transmitters. Coupled with a proper cavity design, such as a resonant cavity, spontaneous light sources emitting at 980 nm have been shown to achieve external quantum efficiencies ($\eta_{ext}$) as high at 27% and an emission spectral width as narrow as 5 nm (see J. J. Wierer, D. A. Kellogg, and N. Holonyak, Jr., Appl. Phys. Lett. 74, 926 (1999)). However, the fastest spontaneous light source shown to date (a light emitting diode) employs p-doping as high as $7 \times 10^{19}$ cm$^{-3}$ to achieve a bandwidth of 1.7 GHz (i.e., recombination lifetime of ~100 ps), at the cost of a reduced internal quantum efficiency to 10% or less (see C. H. Chen, M. Hargis, J. M. Woodall, M. R. Melloch, J. S. Reynolds, E. Yablonovitch and W. Wang, Appl. Phys. Lett. 74, 3140 (1999)). In practice, higher efficiency spontaneous devices such as LEDs or RCLEDs operate with bandwidths that are less than 1 GHz, restricting actual commercial application of spontaneous light transmitters (LEDs and RCLEDs) to less than 1 Gbits/s.

It has previously been proposed that the heterojunction bipolar light emitting transistor (HBLET), which utilizes a high-speed heterojunction bipolar transistor (HBT) structure, could potentially function as a light source with speeds exceeding ten's of GHz (see M. Feng, N. Holonyak, Jr., and W. Hafez, Appl. Phys. Lett. 84, 151 (2004); M. Feng, N. Holonyak, Jr., and R. Chan, Appl. Phys. Lett. 84, 1952 (2004); W. Snodgrass, B. R. Wu, K. Y. Cheng, and M. Feng, IEEE Intl. Electron Devices Meeting (IEDM), pp. 663-666 (2007)). The room temperature, continuous wave operation of a transistor laser further demonstrates that a practical radiative recombination center (i.e., undoped quantum well) can be incorporated in the heavily doped base region of a HBLET (see M. Feng, N. Holonyak, Jr., G. Walter, and R. Chan, Appl. Phys. Lett. 87, 131103 (2005)). Due to the short base effect of tilted charge population in transistors, the effective minority carrier lifetime in the base region of the HBLETs can be progressively reduced to sub-100 ps by tailoring the doping and incorporating QW(s) (see H. W. Then, M. Feng, N. Holonyak, Jr, and C. H. Wu, "Experimental determination of the effective minority carrier lifetime in the operation of a quantum-well n-p-n heterojunction bipolar light-emitting transistor of varying base quantum-well design and doping," Appl. Phys. Lett., vol. 91, 033505, 2007; G. Walter, C. H. Wu, H. W. Then, M. Feng, and N. Holonyak, Jr., "4.3 GHz optical bandwidth light emitting transistor," (submitted to Appl. Phys. Lett.), 2009, supra) In practice, despite the high intrinsic speed of the HBT, the microwave performance of an HBLET is limited by parasitic capacitances, due to factors including extrinsic carrier transport effects and to the need to include light extraction features (such as oxide apertures) not present in traditional high speed HBT devices.

It is among the objects of the present invention to address such limitations of prior devices and techniques, and to improve operation of tilted charge light-emitting devices and techniques, including three terminal light-emitting transistors and two terminal tilted charge light emitters.

SUMMARY OF THE INVENTION

Applicant has discovered that the lateral scaling of a heterojunction bipolar light-emitting transistor (LET) or a tilted charge light-emitting diode can improve both electrical and optical characteristics. For example, the fast recombination dynamics of the intrinsic transistor can be harnessed by scaling down an emitter aperture to reduce lateral extrinsic "parasitic-like" RC charging. The fast spontaneous modulation speeds, together with the high yield and reliability due to ease of fabrication and threshold-less operation of the LET or tilted charge light-emitting diode, offer attractive alternatives to laser sources, especially for use in short range optical data communications and interconnections.

In accordance with an embodiment of a first form of the invention, a method is set forth for producing a high frequency optical signal component representative of a high frequency electrical input signal component, including the following steps: providing a semiconductor transistor structure that includes a base region of a first semiconductor type between semiconductor emitter and collector regions of a second semiconductor type; providing, in said base region, at least one region exhibiting quantum size effects; providing emitter, base, and collector electrodes respectively coupled with said emitter, base, and collector regions; applying electrical signals, including said high frequency electrical signal component, with respect to said emitter, base, and collector electrodes to produce output spontaneous light emission from said base region, aided by said quantum size region, said output spontaneous light emission including said high frequency optical signal component representative of said high frequency electrical signal component; providing an optical window or cavity for said light emission in the region between said base and emitter electrodes; and scaling the lateral dimensions of said optical window or cavity to control the speed of light emission response to said high frequency electrical signal component.

In an embodiment of the first form of the invention, the method further comprises providing an aperture disposed over said emitter region, and said scaling of the lateral dimensions includes scaling the dimensions of said aperture. In one version of this embodiment, the aperture is generally circular and is scaled to preferably about 10 μm or less in diameter, and more preferably about 5 μm or less in diameter. In another version of this embodiment, the window or cavity is substantially rectangular, and said scaling of lateral dimensions comprises providing the window or cavity with linear dimensions of preferably about 10 μm or less, and more preferably about 5 μm or less in diameter. In the practice of an embodiment of the method, the high frequency electrical signal component has a frequency of at least about 2 GHz.

In accordance with an embodiment of a further form of the invention, a method is set forth for producing a high frequency optical signal component representative of a high frequency electrical signal component, including the following steps: providing a layered semiconductor structure including a semiconductor drain region comprising at least one drain layer, a semiconductor base region disposed on said drain region and including at least one base layer, and a semiconductor emitter region disposed on a portion of said base region and comprising an emitter mesa that includes at least one emitter layer; providing, in said base region, at least one region exhibiting quantum size effects; providing a base/drain electrode having a first portion on an exposed surface of said base region and a further portion coupled with said drain region, and providing an emitter electrode on the surface of said emitter region; applying signals with respect to said base/drain and emitter electrodes to produce light emission from said base region; providing an optical window or cavity for said light emission in the region between said first portion of the base/drain electrode and said emitter electrode; and scaling the lateral dimensions of said optical window or cavity to control the speed of light emission response to said high frequency electrical signal component.

In an embodiment of the further form of the invention, said emitter mesa has a substantially rectilinear surface portion, and said step of providing said electrodes comprises providing said emitter electrode along one side of said surface portion of the emitter mesa and providing the first portion of said base/drain electrode on a portion of the base region surface adjacent the opposite side of said emitter mesa surface portion. In this embodiment, the step of providing said electrodes further comprises providing said emitter electrode and the first portion of said base/drain electrode as opposing linear conductive strips, and said scaling of lateral dimensions comprises providing said window or cavity with linear dimensions of preferably about 10 μm or less, and more preferably about 5 μm or less.

Further features and advantages of the invention will become more readily apparent from the following detailed description when taken in conjunction with the accompanying drawings.

DETAILED DESCRIPTION

For an example of an embodiment of the invention, the epitaxial layers of the crystals used for a heterojunction bipolar light emitting transistor (HBLET), fabricated using MOCVD, included a 3000 Å n-type heavily doped GaAs buffer layer, followed by a 500 Å n-type $Al_{0.30}Ga_{0.60}As$ layer, a graded $Al_{0.30}Ga_{0.70}As$ to $Al_{0.90}Ga_{0.10}As$ oxide buffer layer, a 600 Å n-type $Al_{0.98}Ga_{0.02}As$ oxidizable layer, and then a graded $Al_{0.90}Ga_{0.10}As$ to $Al_{0.30}Ga_{0.70}As$ oxide buffer layer that completes the bottom cladding layers. These layers are followed by a 557 Å n-type subcollector layer, a 120 Å $In_{0.49}Ga_{0.51}P$ etch stop layer, a 2871 Å undoped GaAs collector layer, and a 1358 Å average p-doped $3 \times 10^{19}$ cm$^{-3}$ AlGaAs/GaAs graded base layer (the active layer), which includes two undoped 112 Å InGaAs quantum wells (designed for λ≈980 nm). The epitaxial HBTL structure is completed with the growth of the upper cladding layers, which include a 511 Å n-type $In_{0.49}Ga_{0.51}P$ wide-gap emitter layer, a graded $Al_{0.30}Ga_{0.70}As$ to $Al_{0.90}Ga_{0.10}As$ oxide buffer layer, a 600 Å n-type $Al_{0.98}Ga_{0.02}As$ oxidizable layer, and a graded $Al_{0.90}Ga_{0.10}As$ to $Al_{0.30}Ga_{0.70}As$ oxide buffer layer and a 500 Å n-type $Al_{0.30}Ga_{0.70}As$ layer. Finally, the HBLET structure is capped with a 2000 Å heavily doped n-type GaAs contact layer. After various standard etching and contact metallization steps, the completed devices of the first example hereof have an oxide aperture diameter, $D_A$, of ~6 μm on 10 μm emitter mesas.

Figure 1:
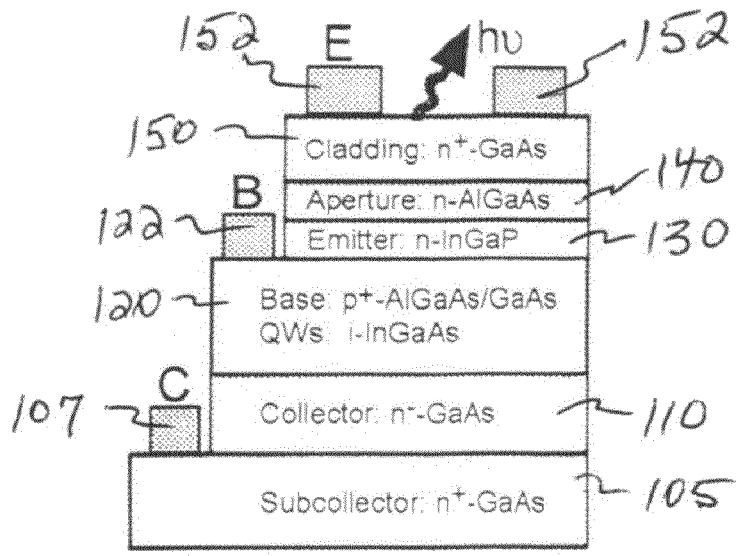
FIG. 1 is a simplified cross-section of a device in which embodiments of the improvements of the invention can be employed.
Figure 2:
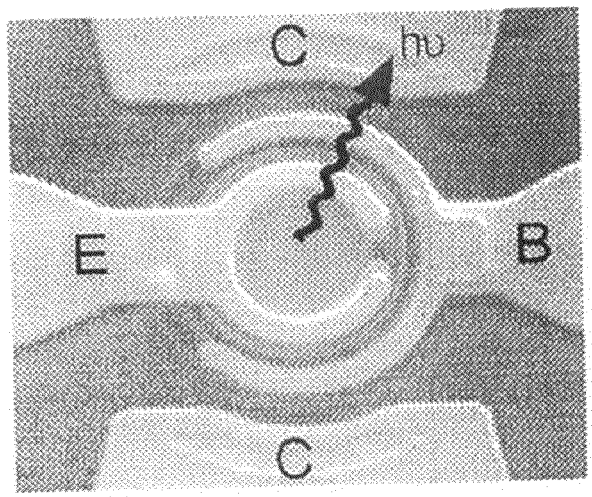
FIG. 2 is a top photographic view showing an example of the layout of conductive contacts or electrodes of the FIG. 1 device.

A simplified schematic of the device cross section and its top view layout are shown in FIGS. 1 and 2. An n+ GaAs subcollector region 105 has an n-type GaAs collector region 110 deposited thereon, followed by p+ AlGaAs/GaAs base region 120, having one or more undoped InGaAs quantum wells (QWs). An emitter mesa is formed over the base, and includes, n-type InGaP emitter layer 130, and n-type AlGaAs aperture layer 140, and an n+ GaAs cladding layer 150. Lateral oxidation can be used to form the central aperture. The collector contact metallization is shown at 107, the base contact metallization is shown at 122, and the emitter metallization is shown at 152. FIG. 2 shows a plan view of the FIG. 1 metallizations; that is, opposing collector contacts (common connection not shown), the base contact 122 including an outer annular ring, and the emitter contact 152 including the inner annular ring. FIG. 2 shows collector (C), base (B), and emitter (E) metallizations, and a representation of light emission (hv) through the aperture.

Figure 3:
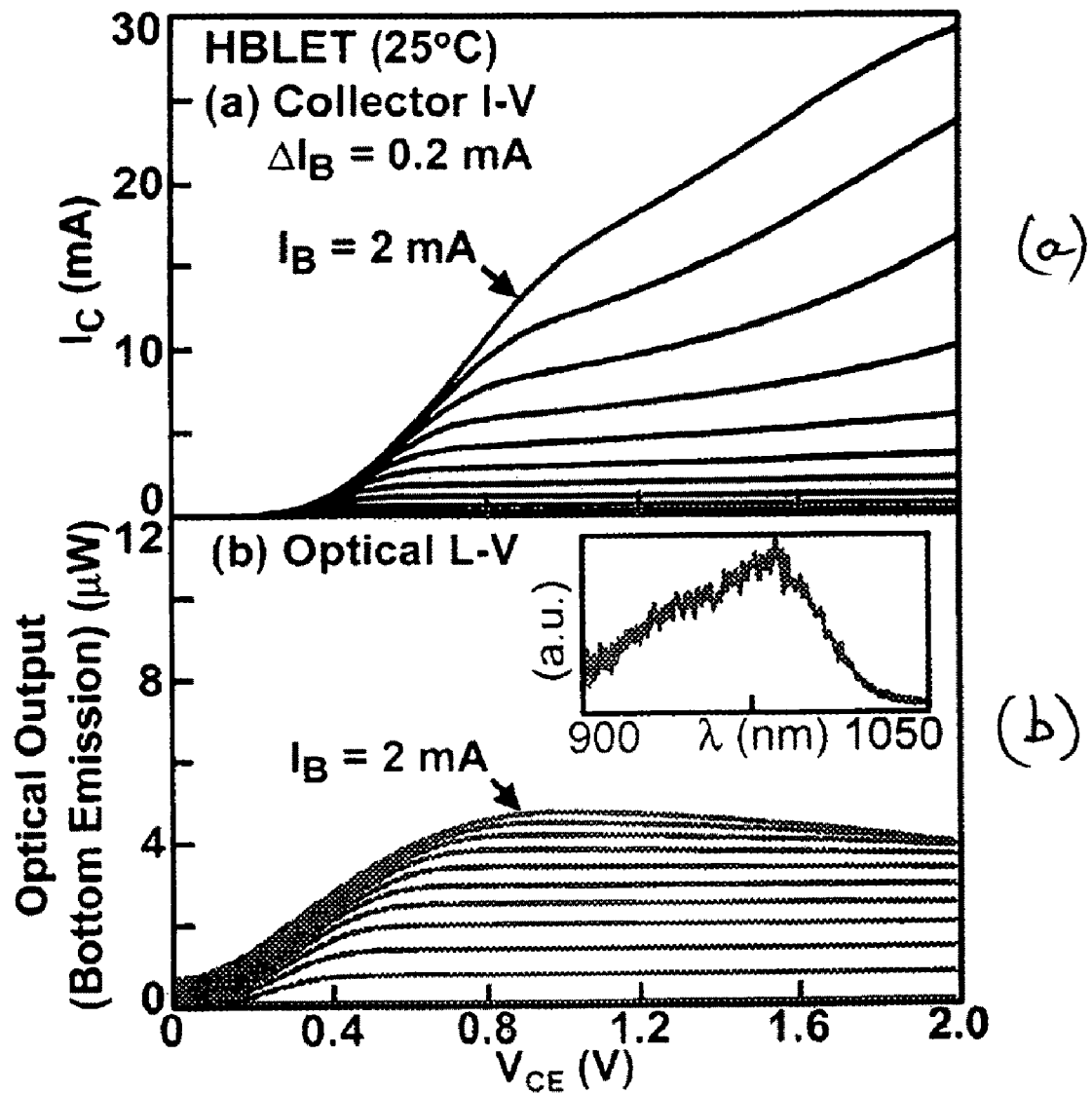
FIG. 3 shows, in graph (a), the collector I-V characteristics and, in graphs (b), the optical output characteristics, of the FIG. 1 device. The light emission is measured from the bottom of the device with a large-area photodetector.

The collector I-V and optical output characteristics are shown in FIGS. 3(a) and 3(b), respectively. The device exhibits a current gain β ($=\Delta I_C/\Delta I_B$) as high as 30 (or 30 dB), e.g., at $I_B$=2 mA and $V_{CE}$=2 V. The light emission in FIG. 3(b) is measured from the bottom of the device with a large-area photodetector. A light extraction efficiency of a single escape cone from the GaAs-air surface, assuming Fresnel reflection losses for normal incidence, is approximately 1.4%. (see M. G. Craford, High Brightness Light Emitting Diodes, Semiconductors and Semimetals, Vol. 48, Academic Press, San Diego, Calif., p. 56 (1997)). The broad spectral characteristics of the optical output (see inset of graph (b); FWHM=76 nm) is indicative of the width of the spontaneous recombination of the HBLET operation. The HBLET of this example does not incorporate a resonant cavity, it being understood that the use of a resonant cavity will substantially increase optical output extraction.

Operating the common-collector HBLET with the BC port as the rf-input allows for simultaneous electrical-to-optical output conversion, and electrical output gain at the EC output port. Due to its three-port nature, its optical output can also respond to input modulation signals at the EC-port, although in this configuration, the device does not provide a simultaneous electrical output gain at the BC-port. Deploying the EC-port as the rf-input has the advantage of better matched input impedance (50Ω standard) for maximal power transfer. The BC-port input impedance is generally higher than the EC-input impedance due to the reverse-biased BC junction, and can be advantageous where high input impedances are desirable for maximizing circuit performances.

Figure 4:
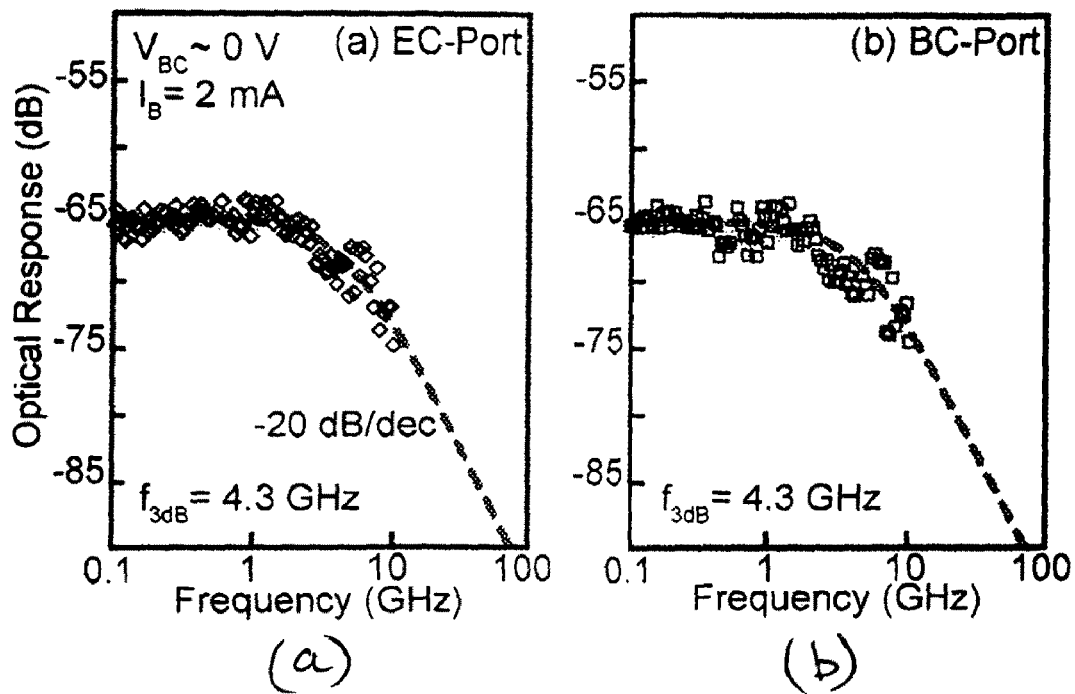
FIG. 4 shows, in graphs (a) and (b), respectively, the optical response of the common-collector HBLET device to BC and EC rf input at biases $I_B$=2 mA and $V_{BC}$~0 V (condition for reverse-biased BC junction).
Figure 5:
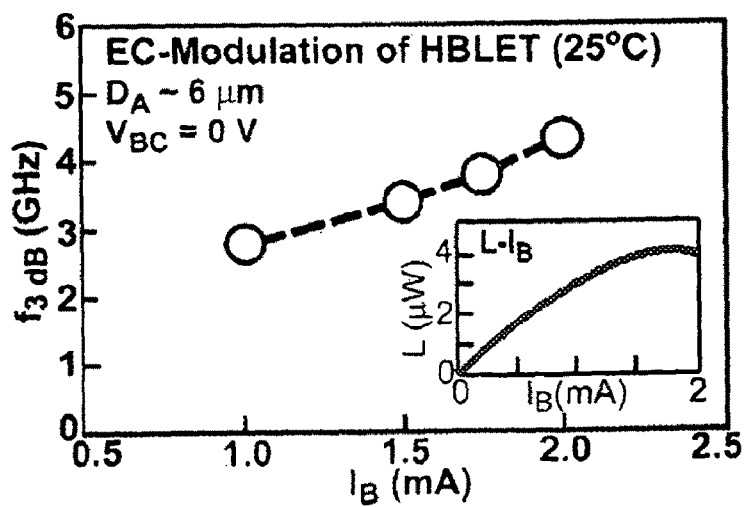
FIG. 5 is a plot showing $F_{3dB}$ (in GHz) as a function of $I_B$ for EC input port modulation of the HBLET with $D_A$=6 μm and $V_{BC}$ at 0 volts. The inset shows the optical output (detector output in microwatts) as a function of $I_B$.

In an example hereof, the optical response is measured with a high-speed p-i-n photodetector with bandwidth≧12 GHz and a 50-GHz electrical spectrum analyzer. A frequency generator (0.05-20 GHz) is used for the input signal to the device. The optical response of the common-collector HBLET to BC and EC rf-input modulation at biases $I_B=2$ mA and $V_{BC}$~0 V (condition for reverse-biased BC junction) are shown in FIGS. 4(b) and 4(a), respectively. In both cases the response bandwidth at −3 dB, $f_{3\ dB}$, is 4.3 GHz. In FIG. 5, $f_{3\ dB}$ is seen to improve from 2.8 to 4.3 GHz as $I_B$ is increased from 1 to 2 mA. The optical output and response bandwidth are shown up to $I_B=2$ mA where the optical output (see plot of inset) begins to degrade due to saturation and heating.

The optical response, H(f) may be expressed as $$H(f) = \frac{A_o}{1 + j\frac{f}{f_{3dB}}}, \quad (1)$$

where $A_o$ is the electrical-to-optical conversion efficiency, and $f_{3\ dB}$ is the bandwidth at −3 dB. $f_{3\ dB}$ is related to an effective base carrier recombination lifetime $\tau_B$ (absent stimulated recombination but including the effects of undesirable parasitic RC-charging time) by the relation, $$f_{3dB} = \frac{1}{2\pi\tau_B}. \quad (2)$$

A value for $f_{3\ dB}$ of 4.3 GHz therefore corresponds to a $\tau_B$ of 37 ps. Sub-100 ps recombination speeds are not readily achieved in a double heterojunction (DH) p-i-n light emitting diode, because equal number densities of electrons (n cm$^{-3}$) and holes (p cm$^{-3}$) are injected into the neutral undoped active region to preserve charge neutrality; therefore, an extremely high injection level and equivalently, a high charge population (since $I_{inject}/q=B_{rad}\cdot p\cdot Vol=n\cdot Vol/\tau_B$) are required in order to achieve high recombination speeds. In a HBLET, the holes are built-in by p-doping in the base, and re-supplied by an ohmic base current, while the (minority carrier) electrons are injected from the heterojunction emitter. Moreover, as opposed to the charge 'pile-up' condition in a double heterojunction p-i-n diode, the dynamic 'tilted' charge flow condition is maintained in the base of the transistor with the electrical collector (reverse-biased BC junction) in competition with base recombination. Because of the 'tilted' base population, current flow is a function of the slope in the charge distribution, and high current densities are possible without requiring extreme carrier densities. The heterojunction bipolar transistor (HBT) n-p-n structure, therefore, possesses intrinsic advantages (in how charge is handled) over the double heterojunction p-i-n structure.

Thus, the 37 ps carrier lifetime observed in the HBLET hereof indicates that spontaneous recombination can be "fast", and higher modulation speeds are possible by further reducing the undesirable parasitics. In addition, due to the absence of the relaxation oscillations typically observed in laser devices, and the lesser signal attenuation slope of −20 dB per decade beyond the 3 dB bandwidth in contrast to the −40 dB per decade slope of laser response, an HBLET can potentially be deployed at data rates much higher than 4.3 Gb/s, with attendant advantage for short range optical data communications.

Figure 6:
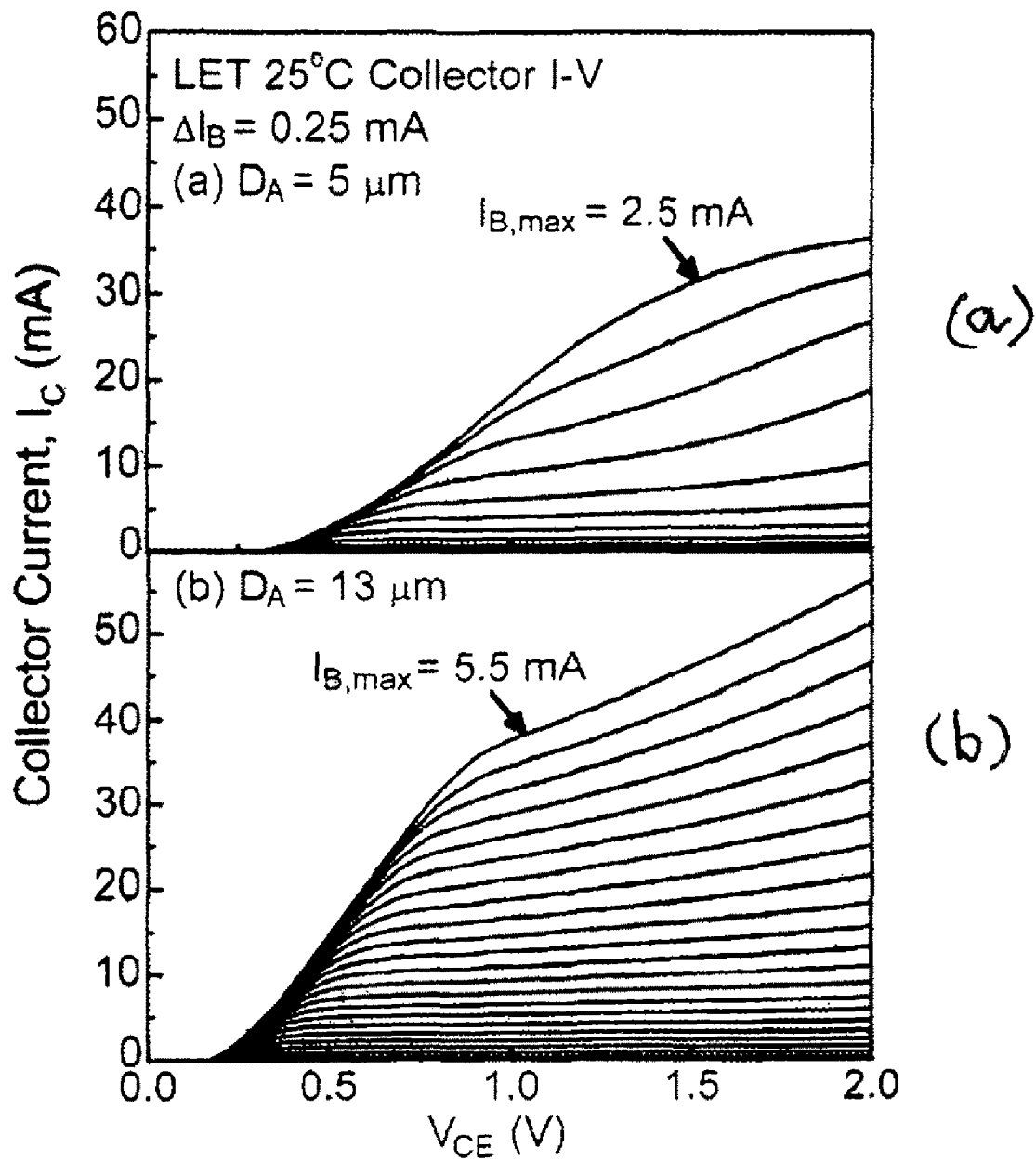
FIG. 6, plots (a) and (b), show the HBLET collector IV characteristics for examples with emitter sizes of (a) $D_A$=5 um and (b) $D_A$=13 μm.
Figure 7:
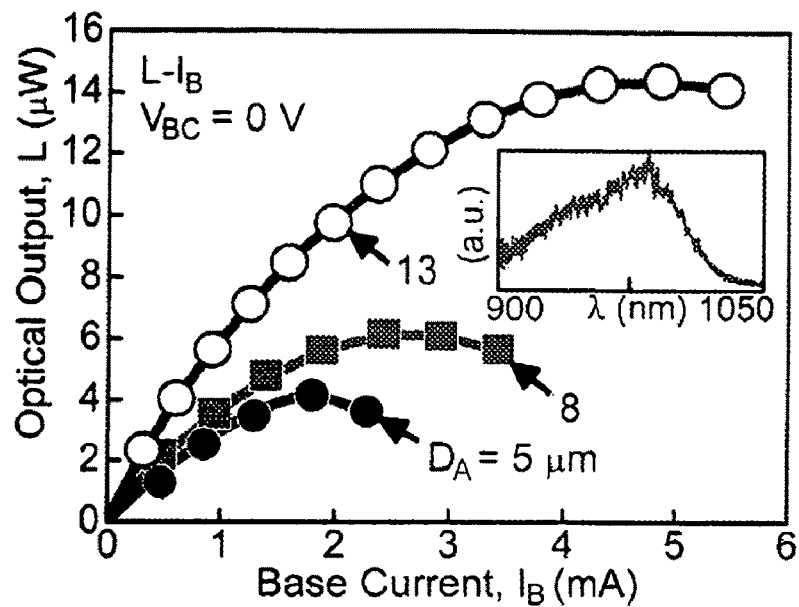
FIG. 7 shows HBLET optical light output (measured from the bottom) as a function base current, $I_B$, with $V_{BC}$=0 V, for the three devices of this example, with $D_A$=5 μm, $D_A$=8 μm, and $D_A$=13 μm. The inset shows the optical spectrum as arbitrary units as a function of wavelength.

In further examples hereof, devices are fabricated as previously described, but with emitter aperture widths of 5 µm, 8 µm, and 13 µm, achieved by selective lateral oxidation of the n-Al$_{0.98}$Ga$_{0.02}$As layer (aperture layer 140 of FIG. 1). The collector I-V characteristics for HBLETs with aperture widths of 5 µm (plot (a)) and 13 µm (plot (b)) and with $V_{BC}=0$ (that is, base and collector shorted) are shown in FIG. 6. FIG. 7 shows the corresponding optical light output characteristic L-$I_B$ as measured from the bottom-side of each of the three devices. At comparable base currents $I_B$, the device with a 5 µm aperture achieves 2.4 times higher current gain than the 13 µm device. The 13 µm HBLET, however, produces an optical output 2.4 times higher. The current gain, β, and optical output saturate at high bias conditions ($V_{CE}\geq2$ V) due to excessive heating as the devices are on semi-insulating substrate and operated without any temperature control. While total recombination radiation increases for the larger device, only a fraction of the radiative recombination occurs within the intrinsic transistor base region. Due to the 'ring'-like geometry employed in these examples, the proper intrinsic transistor base spans a concentric region with a radius proportional to $D_A/2$, and an intrinsic device width (active edge) denoted by, say, t. Hence, the proportion of intrinsic base recombination to the total (extrinsic and intrinsic) recombination is roughly inversely proportional to the aperture width $D_A$, and hence, scales by the simple ratio, ~$\pi D_A t/\pi (D_A/2)^2=4t/D_A$. As the device aperture size, $D_A$, is reduced, an increasingly larger proportion of the injected carriers are confined to the intrinsic transistor base region (i.e., higher $4t/D_A$), resulting in higher current densities and enhanced current gains. However, with a larger lateral geometry (i.e., larger $D_A$ and, hence lower $4t/D_A$), the carrier contribution to extrinsic base (radiative and non-radiative) recombination increases, resulting in a lower β and commensurately higher light output. A typical optical spectrum of the devices (inset of FIG. 7) shows a FWHM of 76 nm and demonstrates that the device is operating in spontaneous recombination. The light extraction of a single escape cone from the GaAs-air surface for these examples is highly inefficient. Assuming Fresnel reflection losses for normal incidence, the extraction efficiency is estimated to be 1.4% (see W. Snodgrass, B. R. Wu, K. Y. Cheng, and M. Feng, IEEE Intl. Electron Devices Meeting (IEDM), pp. 663-666 (2007).

Figure 8:
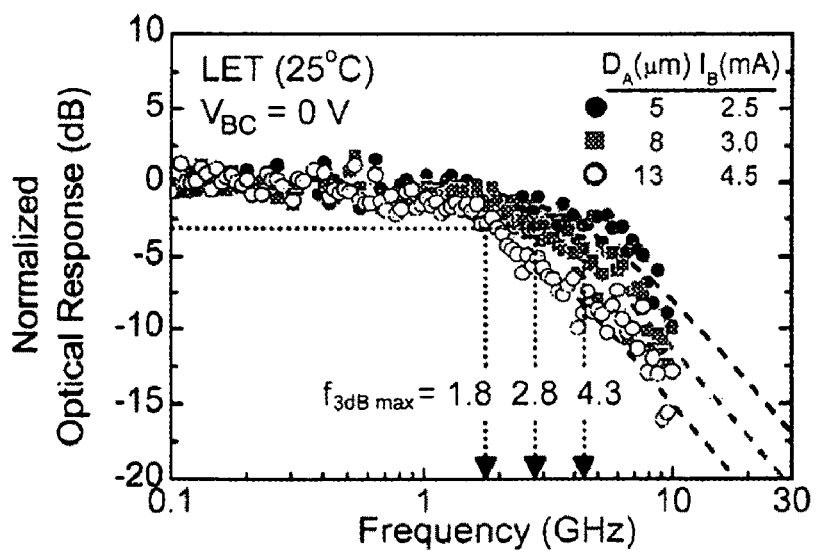
FIG. 8 is a plot of normalized response as a function of frequency, with $V_{BC}$=0, for the three devices of this example with $D_A$=5 μm, $D_A$=8 μm, and $D_A$=13 μm.
Figure 9:
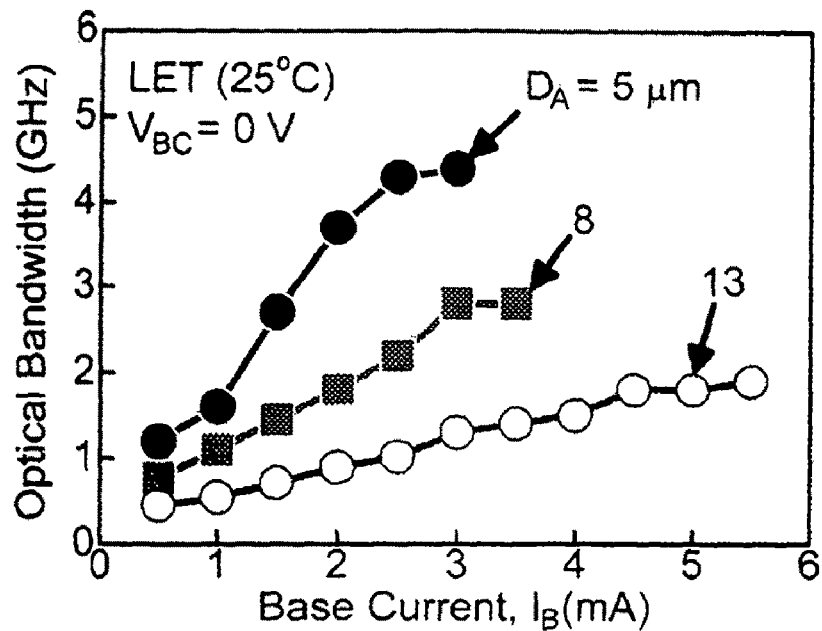
FIG. 9 is a plot of optical bandwidth as a function of base current for the three devices of this example with $D_A$=5 μm, $D_A$=8 μm, and $D_A$=13 μm.

In FIG. 8 the HBLET is operated in the common-collector configuration with rf-input applied at the EC-port with $V_{BC}=0$ V. Although in this configuration the device does not provide a simultaneous output electrical gain, the EC-input impedance, $Z_{EC}$, is well matched to the source impedance (50Ω standard) for maximal power transfer. In this example the optical response is again measured with a 12 GHz p-i-n photodetector and a 50-GHz electrical spectrum analyzer. Also, a frequency sweep generator up to 20 GHz is again used for the input signal to the device. FIG. 8 shows the maximum bandwidth optical response of 4.3, 2.8, and 1.8 GHz achieved by HBLETs of aperture size $D_A=5$, 8, and 13 µm, respectively. Higher bandwidths are attained with HBLETs employing a smaller aperture because a larger proportion of radiative recombination is confined to the intrinsic base of the HBLET where the intrinsic recombination speed of the carriers are faster, consistent with the observations derived from the collector I-V characteristics (FIG. 6) and optical L-$I_B$ characteristics (FIG. 7). The plot of the optical bandwidth vs. the bias base current $I_B$ for HBLETs of various aperture sizes (FIG. 9) shows the increase in the optical bandwidth as the bias current ($I_B$ and hence, $I_E$) is increased. The maximum bandwidth is achieved where the optical and electrical characteristics begin to saturate due to heating, as is evident from FIGS. 6 and 7.

In the absence of stimulated recombination, one can simply express the optical response as a single-pole transfer function H(f) with $f_{3dB}$ representing the −3 dB frequency. The value $f_{3dB}$ is related to an extrinsic base carrier recombination lifetime $\tau_B$ by $f_{3dB}=1/(2\pi\tau_B)$. Therefore, an extrinsic $\tau_B$ of 37 ps is inferred from the value $f_{3dB}$=4.3 GHz (for the device where $D_A$=5 μm), while a $\tau_B$ of 88 ps is obtained for a 13-μm-aperture device. Lateral extrinsic recombination therefore forms an equivalent parasitic-like RC-charging time that limits the optical bandwidth of the device. Therefore, by lateral scaling, the device's performance can be improved by 'channeling' (via high current densities) and 'limiting' (via smaller apertures) the carriers to feed only radiative recombination originating or emanating from the intrinsic transistor base. Due to the presence of a finite (parasitic) lateral edge in the device construction, the $\tau_B$ obtained of 37 ps is still dominated or limited extrinsically. This shows that the intrinsic transistor base recombination lifetime can be much faster than 37 ps, and implies that an even higher spontaneous optical bandwidth is possible.

Figure 10:
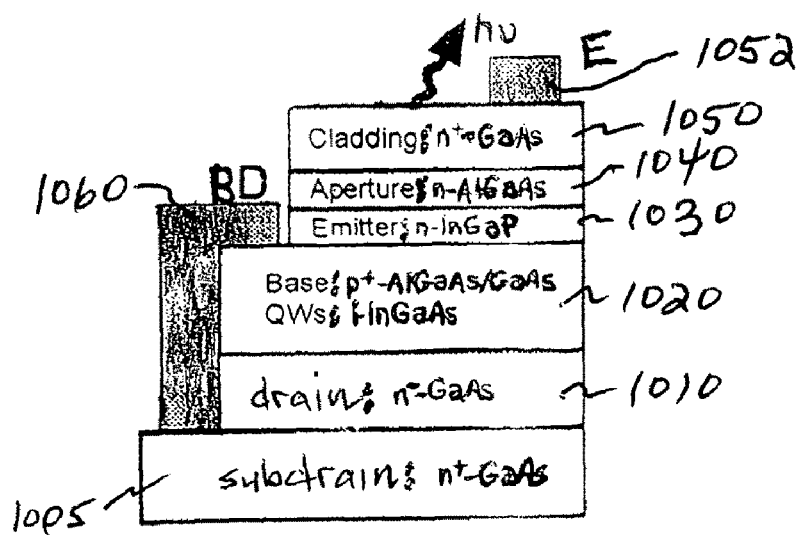
FIG. 10 is a simplified cross-sectional diagram of a tilted-charge light-emitting diode, in which an embodiment of the invention can be employed.
Figure 11:
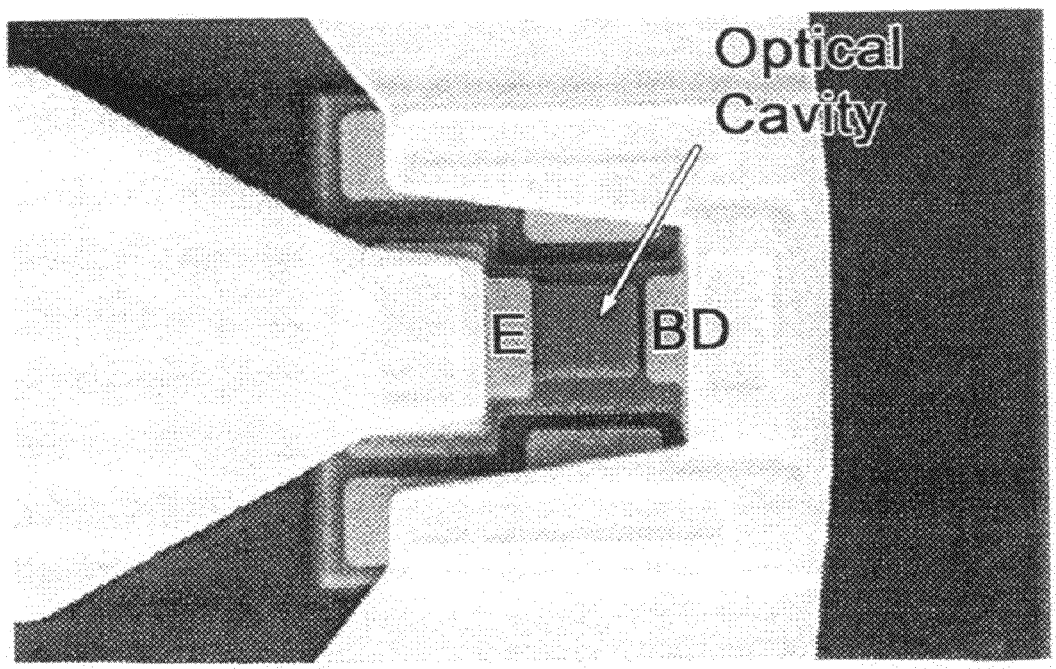
FIG. 11 is a top photographic view of the FIG. 10 device.

In copending U.S. patent application Ser. No. 12/799,080, filed of even date herewith and assigned to the same assignees are the present Application, there is disclosed an embodiment of a two terminal tilted-charge light emitting diode having a non-circular (e.g. rectangular) region as its optical window or cavity, between linear emitter and base electrodes or contacts which can be opposing conductive strips. This configuration has the advantage of enhanced uniformity of carrier injection in the active region and efficient light output. The above-described scaling advantages are also applicable to this configuration. Reference can be made to the simplified cross-section of FIG. 10 hereof in which an n+ GaAs subdrain 1005 has an n-type drain region 1010 deposited thereon, followed by p+ AlGaAs/GaAs base region 1020, having one or more InGaAs quantum wells (QWs). An emitter mesa is formed over the base and includes an n-type InGaP emitter layer 1030, and an optional n-type AlGaAs aperture layer 1040, and an n+ GaAs cladding layer 1050. The emitter electrode metal is shown at 1052, and base/drain electrode metal at 1060. FIG. 11 is a top photographic view of FIG. 10 device, showing emitter electrode (E) and base/drain electrode (BD), and denoting the rectangular optical window or cavity (i.e., between the upper "flange" portion of the BD electrode 1060 and the E electrode 1052) with an arrow. A similar configuration, between linear base and emitter electrodes, can also be employed in a three terminal light-emitting transistor or laser transistor. The above-described scaling advantages are also applicable to these device configurations.

The invention claimed is:

1. A method for producing a high frequency optical signal component representative of a high frequency electrical signal component, comprising the steps of:

providing a layered semiconductor structure including a semiconductor drain region comprising at least one drain layer, a semiconductor base region disposed on said drain region and including at least one base layer, and a semiconductor emitter region disposed on a portion of said base region and comprising an emitter mesa that includes at least one emitter layer;

providing, in said base region, at least one region exhibiting quantum size effects;

providing a base/drain electrode coupled with said base region and coupled with said drain region, and providing an emitter electrode coupled with said emitter region, said base/drain electrode having a first portion on an exposed surface of said base region and a further portion coupled with said drain region;

providing an aperture disposed over said emitter region;

applying signals with respect to said base/drain and emitter electrodes to produce light emission from said base region, said step of providing an aperture further comprising providing an optical cavity for said light emission in the region between said first portion of the base/drain electrode and said emitter electrode; and scaling said aperture to control the speed of light emission response to said high frequency electrical signal component.

2. The method as defined by claim 1, wherein said emitter mesa has a substantially rectilinear surface portion, and wherein said step of providing said electrodes comprises providing said emitter electrode along one side of said surface portion of the emitter mesa and providing the first portion of said base/drain electrode on a portion of the base region surface adjacent the opposite side of said emitter mesa surface portion.

3. The method as defined by claim 1, wherein said step of providing said electrodes further comprises providing said emitter electrode and the first portion of said base/drain electrode as opposing linear conductive strips.

4. The method as defined by claim 1, wherein said cavity is substantially rectangular, and wherein said scaling of lateral dimensions comprises providing said cavity with linear dimensions of about 10 μm or less.

5. The method as defined by claim 1, wherein said cavity is substantially rectangular, and wherein said scaling of lateral dimensions comprises providing said cavity with linear dimensions of about 5 μm or less.

6. The method as defined by claim 1, wherein said high frequency electrical signal component has a frequency of at least about 2 GHz.

\* \* \* \* \*